(12) United States Patent
Henderson et al.

(10) Patent No.: US 8,890,316 B2
(45) Date of Patent: Nov. 18, 2014

(54) IMPLEMENTING DECOUPLING DEVICES INSIDE A TSV DRAM STACK

(71) Applicant: International Business Machines Corporation, Armonk, NY (US)

(72) Inventors: Joab D. Henderson, Pfugerville, TX (US); Kyu-hyoun Kim, Mount Kisco, NY (US); Warren E. Maule, Cedar Park, TX (US); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/150,600

(22) Filed: Jan. 8, 2014

(65) Prior Publication Data

US 2014/0117500 A1   May 1, 2014

Related U.S. Application Data

(62) Division of application No. 13/477,371, filed on May 22, 2012, now Pat. No. 8,697,567.

(51) Int. Cl.
| | | |
|---|---|---|
| *H01L 21/768* | (2006.01) | |
| *H01L 23/48* | (2006.01) | |
| *H01L 25/065* | (2006.01) | |
| *H01L 23/498* | (2006.01) | |

(52) U.S. Cl.
CPC ... *H01L 25/0657* (2013.01); *H01L 2225/06541* (2013.01); *H01L 2225/06513* (2013.01); *H01L 23/481* (2013.01); *H01L 23/498* (2013.01)

USPC .... 257/738; 257/774; 257/737; 257/E23.116; 257/E21.502

(58) Field of Classification Search
USPC .......... 257/737, 774, 738, E23.116, E21.502
See application file for complete search history.

(56) References Cited

U.S. PATENT DOCUMENTS

| | | |
|---|---|---|
| 7,884,458 B2 | 2/2011 | Kang et al. |
| 7,999,297 B2 | 8/2011 | Yang |

(Continued)

OTHER PUBLICATIONS

"Low-Cost On-Chip Passive Devices Formed by Through Silicon Vias", Disclosed Anonymously, IP.com No. IPCOM000203775D, IP.com Electronic Publication: Feb. 1, 2011.

(Continued)

*Primary Examiner* — Marc Armand
(74) *Attorney, Agent, or Firm* — Joan Pennington (57) ABSTRACT

A method and structures are provided for implementing decoupling capacitors within a DRAM TSV stack. A DRAM is formed with a plurality of TSVs extending completely through the substrate and filled with a conducting material. A layer of glass is grown on both the top and bottom of the DRAM providing an insulator. A layer of metal is grown on each glass layer providing a conductor. The metal and glass layers are etched through to TSVs with a gap provided around the perimeter of via pads. A respective solder ball is formed on the TSVs to connect to another DRAM chip in the DRAM TSV stack. The metal layers are connected to at least one TSV by one respective solder ball and are connected to a voltage source and a dielectric is inserted between the metal layers in the DRAM TSV stack to complete the decoupling capacitor.

9 Claims, 6 Drawing Sheets

(56) References Cited

U.S. PATENT DOCUMENTS

| | | |
|---|---|---|
| 2008/0216298 A1 | 9/2008 | Dudnikov |
| 2010/0230735 A1 | 9/2010 | Zhu |
| 2011/0108948 A1 | 5/2011 | Kim et al. |
| 2011/0291266 A1* | 12/2011 | Jin et al. .................. 257/737 |
| 2011/0305100 A1 | 12/2011 | Yu et al. |
| 2011/0316119 A1 | 12/2011 | Kim et al. |
| 2012/0007251 A1 | 1/2012 | Hwang et al. |
| 2012/0025349 A1 | 2/2012 | Lee et al. |
| 2013/0020719 A1 | 1/2013 | Jung et al. |

OTHER PUBLICATIONS

"Power Supply for 3D Chip Stack", Disclosed Anonymously, IP.com No. IPCOM000194113D, IP.com Electronic Publication: Mar. 16, 2010.

"Design Space Exploration for 3D-stacked DRAMs", by Christian Weis et al., 2011 Design, Automation & Test in Europe Conference & Exhibits, pp. 1-6, 2011.

"A Silicon Interposer With an Integrated SrTiO3 Thin Film Decoupling Capacitor and Through-Silicon Vias" by Akinobu Shibuya et al., IEEE Transactions on Components and Packaging Technologies, vol. 33, No. 3, Sep. 2010.

* cited by examiner

IMPLEMENTING DECOUPLING DEVICES INSIDE A TSV DRAM STACK

This application is a divisional application of Ser. No. 13/477,371 filed May 22, 2012.

FIELD OF THE INVENTION

The present invention relates generally to the data processing field, and more particularly, relates to a method and structures for implementing decoupling capacitors within a dynamic random access memory (DRAM) Through-Silicon-Via (TSV) stack.

DESCRIPTION OF THE RELATED ART

As circuits become smaller and switching times become faster, the importance of decoupling capacitors increases. For DRAMs it is possible to go from a state with low power consumption to a state with high power consumption very quickly. If the power supply cannot react in time, this additional current draw will cause a droop in the supply voltage. When DRAMs are stacked, this issue is magnified due to the additional loading of the master rank any time that a rank is accessed.

Through-Silicon-Via (TSV) or TSV interconnections are used for various semiconductor chips and semiconductor chip stacking devices. Integrated circuit die stacking with packaging through silicon via (TSV) interconnections and other packaging techniques enable interconnecting die in ultra close proximity using the vertical dimension. These arrangements enable higher performance and packaging density.

A need exists for an effective mechanism and method of implementing decoupling capacitors within a DRAM TSV stack to minimize voltage droop in a supply voltage for the DRAMs.

SUMMARY OF THE INVENTION

Principal aspects of the present invention are to provide a method and structures for implementing decoupling capacitors within a DRAM TSV stack. Other important aspects of the present invention are to provide such method and structures substantially without negative effects and that overcome many of the disadvantages of prior art arrangements.

In brief, a method and structures are provided for implementing decoupling capacitors within a DRAM TSV stack. A DRAM is formed with a plurality of TSVs extending completely through the substrate and filled with a conducting material. A layer of glass is grown on both the top and bottom of the DRAM providing an insulator. A layer of metal is grown on each glass layer providing a conductor. The metal and glass layers are etched through to TSVs with a gap provided around the perimeter of via pads. A respective solder ball is formed on the TSVs to connect to another DRAM chip in the DRAM TSV stack. The metal layers are connected to at least one TSV by one respective solder ball and are connected to a voltage source and a dielectric is inserted between the metal layers in the DRAM TSV stack to complete the decoupling capacitor.

In accordance with features of the invention, the decoupling capacitors within the TSV DRAM stack minimize the impact of voltage droops when the DRAMs ramp up from a state with low power consumption to a state with high power consumption, such as when the DRAMs ramp up from an idle state to a high utilization state.

In accordance with features of the invention, at least one respective solder ball is connected to the metal layer by a plurality of solder balls.

In accordance with features of the invention, at least one respective solder ball is an enlarged, elongated solder connected to the metal layer.

In accordance with features of the invention, the metal layer includes extended contact portions connected to at least one respective solder ball.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing decoupling capacitors within a dynamic random access memory (DRAM) Through-Silicon-Via (TSV) stack. The decoupling capacitors within the TSV DRAM stack minimize the impact of voltage droops when the DRAMs ramp up from a state with low power consumption to a state with high power consumption.

Figure 1:
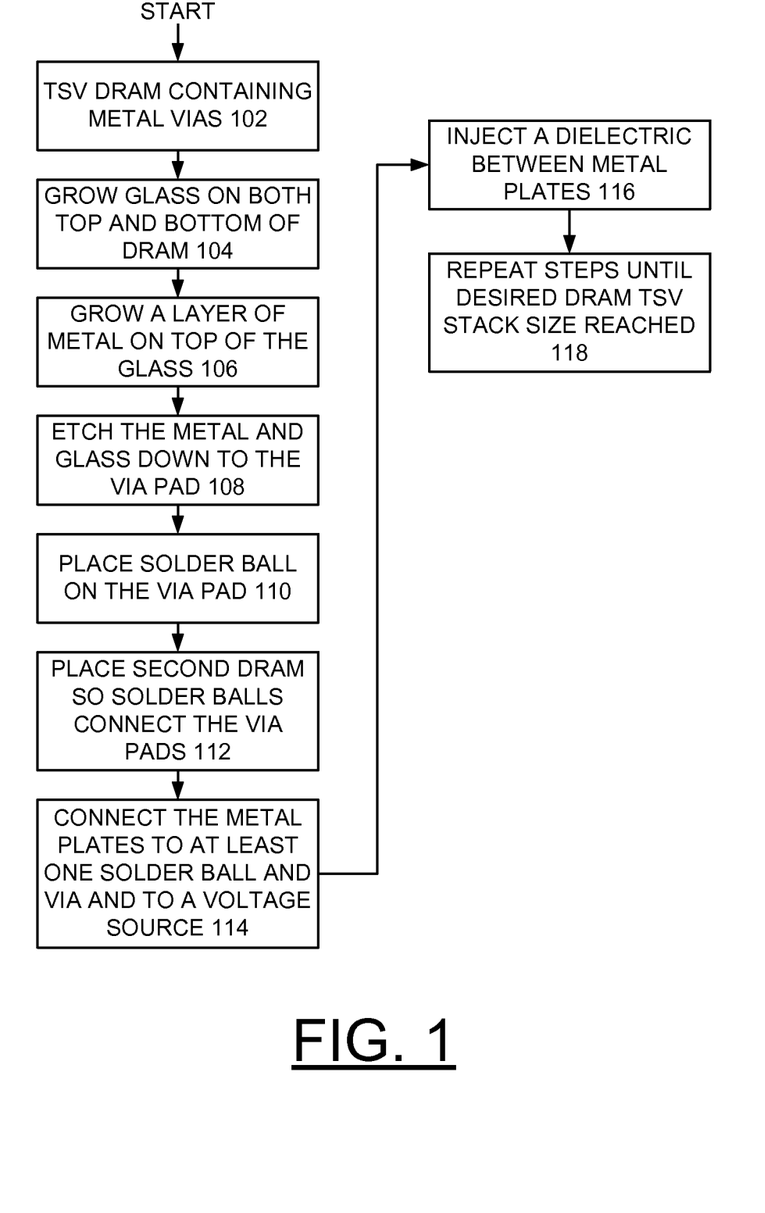
FIG. 1 is a flow chart illustrating exemplary processing steps for fabricating decoupling capacitors within a dynamic random access memory (DRAM) Through-Silicon-Via (TSV) stack in accordance with the preferred embodiment.

Referring now to FIG. 1, there are shown example processing steps for fabricating decoupling capacitors within a dynamic random access memory (DRAM) Through-Silicon-Via (TSV) stack in accordance with a preferred embodiment starting with a semiconductor chip including a DRAM formed with a plurality of TSVs extending completely through the substrate and filled with a conducting material, such as metal vias as indicated at a block 102. The TSV is filled with a suitable electrically conductive metal or metal alloy material, for example, copper, titanium, tungsten, aluminum, Al (Cu), or other conventional conductive material used for TSVs.

A layer of glass is grown on both the top and bottom of the DRAM providing an insulator as indicated at a block 104. As indicated at a block 106 a layer of metal is grown on each glass layer providing a conductor. As indicated at a block 108 the metal layer and the glass layers are etched through to via pads. A gap is provided around the perimeter of the via pads. A respective solder ball is formed on the vias that is used to connect to another DRAM chip in the DRAM TSV stack as indicated at a block 110. A second DRAM is place so that the solder balls connect the via pads as indicated at a block 112.

The metal layers are connected to at least one via with one respective solder ball and are connected to a voltage source as indicated at a block 114. A dielectric is inserted between the metal layers in the DRAM TSV stack to complete the decoupling capacitor as indicated at a block 116. The fabricating steps are repeated until a desired DRAM TSV stack size is reached as indicated at a block 118.

Figure 2A:
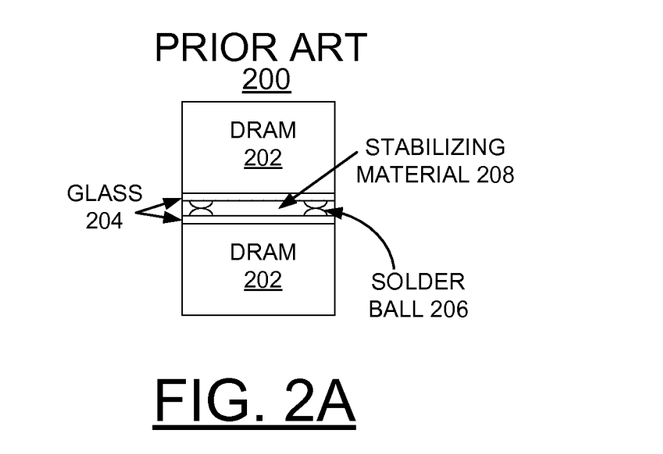
FIGS. 2A, and 2B are high level side views illustrating a conventional DRAM TSV stack and an example DRAM TSV stack incorporating a decoupling capacitor in accordance with the preferred embodiments.

Referring now to FIG. 2A, there is shown a conventional DRAM TSV stack generally designated by the reference character 200. As shown the conventional DRAM TSV stack 200 includes a first and second semiconductor chips, each chip including a DRAM 202. Each chip DRAM 202 includes a glass layer 204 providing an insulator. Each chip DRAM 202 includes a plurality of solder balls 206 connecting the DRAMs 202 together with a stabilizing material 208 provided between the glass layers 204.

Figure 2B:
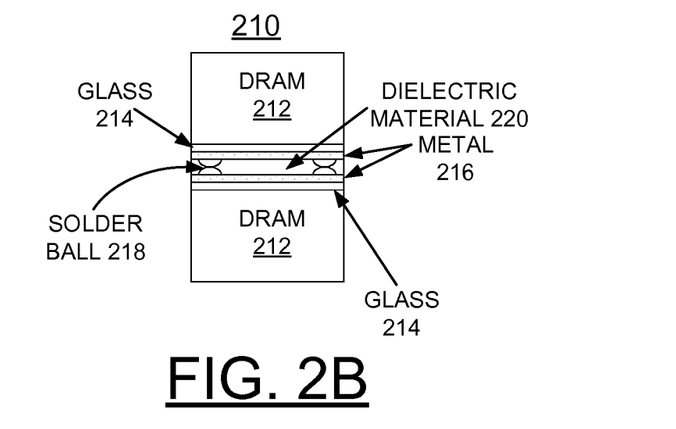

Referring now to FIG. 2B, there is shown an example DRAM TSV stack incorporating a decoupling capacitor generally designated by the reference character 210 in accordance with the preferred embodiments. DRAM TSV stack 210 includes a first and second semiconductor chips, each chip including a DRAM 212. Each chip DRAM 212 includes a glass layer 214 providing an insulator, and a metal layer 216 disposed on the glass layer 214 providing a conductor.

Each chip DRAM 212 includes a plurality of solder balls 218 connecting the DRAMs 212 together. The metal layers 216 are separated by the height of the solder balls 218, and are connected to a respective power supply voltage source. The metal layers 216 are deposited on the glass layer 214 and are formed of any suitable electrically conductive material, for example, of Cu, Al, Al (Cu), and W. A dielectric material 220 is inserted between the metal layers 216 forming the decoupling capacitor. The dielectric material 220 also provides a stabilizing function for the DRAM TSV stack 210. The dielectric material 220 includes, for example, a dielectric material having a thickness corresponding to the gap between the DRAMs 212 and having a selected relative permittivity or dielectric constant to create a desired decoupling capacitor.

It should be understood that the present invention is not limited to the illustrated DRAM TSV stack 212 incorporating a decoupling capacitor. A selected electrolytic material or electrolyte 220 can be inserted between the metal layers 216 creating a battery.

The decoupling capacitor formed within the TSV DRAM stack 210 minimizes the impact of voltage droops when the DRAMs 212 ramp up from a state with low power consumption to a state with high power consumption. When the DRAMs 212 to go from a state with low power consumption to a state with high power consumption very quickly and the power supply cannot react in time, this additional current draw will cause a droop in the supply voltage. When DRAMs are stacked, this issue is magnified due to the additional loading of the master rank any time that a rank is accessed.

In accordance with features of the invention, providing decoupling capacitors within the DRAM TSV stack, such as the DRAM TSV stack 210, effectively minimizes such voltage droop. The current solutions for this issue require increasing the supply voltage to prevent the droop from impacting the DRAMs or investing in more costly supplies to react faster to the transition. The structures of the invention implementing decoupling capacitors within a DRAM TSV stack, such as the DRAM TSV stack 210, allow the total power that the DRAM memory draws to be decreased from the present implementation by allowing the supply voltage to be lower. Additionally, the structures of the invention do not require as quick of a response time as the current solution, which allows a less expensive power supply to be used.

Figure 3A:
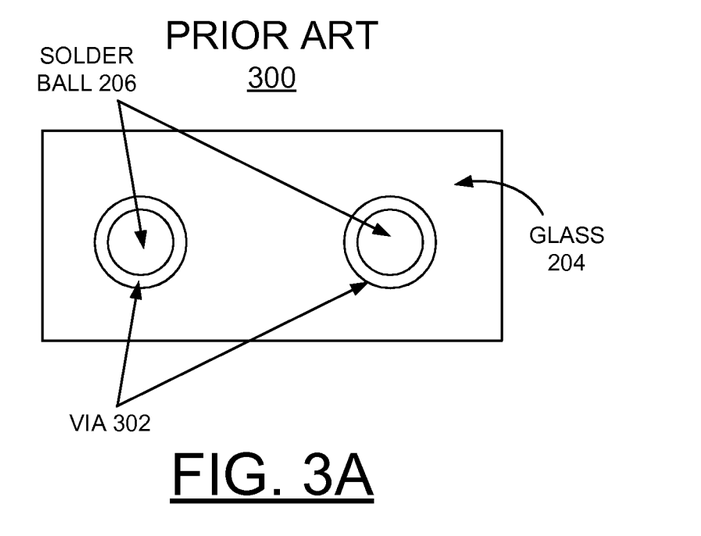
FIGS. 3A, and 3B are top views illustrating the conventional DRAM TSV stack and the example DRAM TSV stack incorporating a decoupling capacitor in accordance with a preferred embodiment.
Figure 3B:
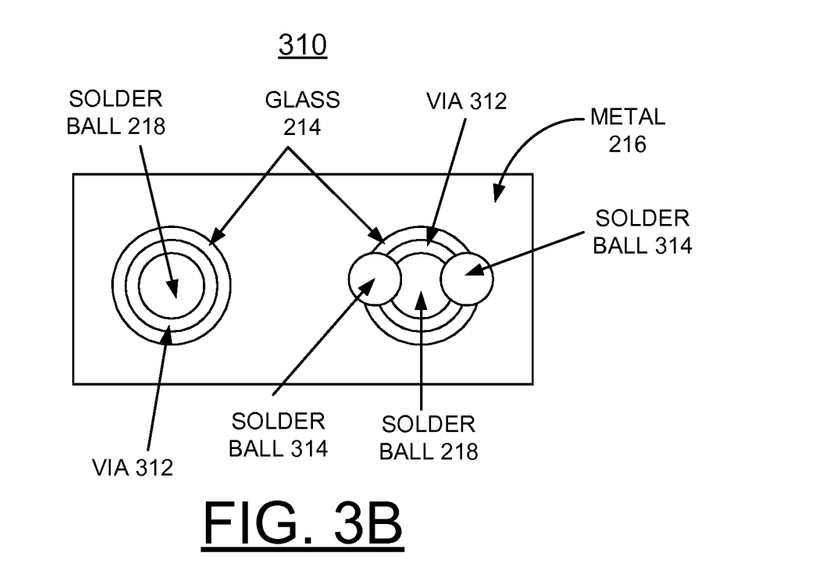

Referring to FIGS. 3A, and 3B, there are shown top views illustrating the conventional DRAM TSV stack 200 of FIG. 2A generally designated by the reference character 300 and illustrating the example DRAM TSV stack 210 incorporating the decoupling capacitor generally designated by the reference character 310 in accordance with a preferred embodiment.

In FIG. 3A, the illustrated conventional DRAM TSV stack 300 includes a plurality of vias 302 extending through the glass layer 204 with a respective solder ball disposed on the vias 302.

Figure 3C:
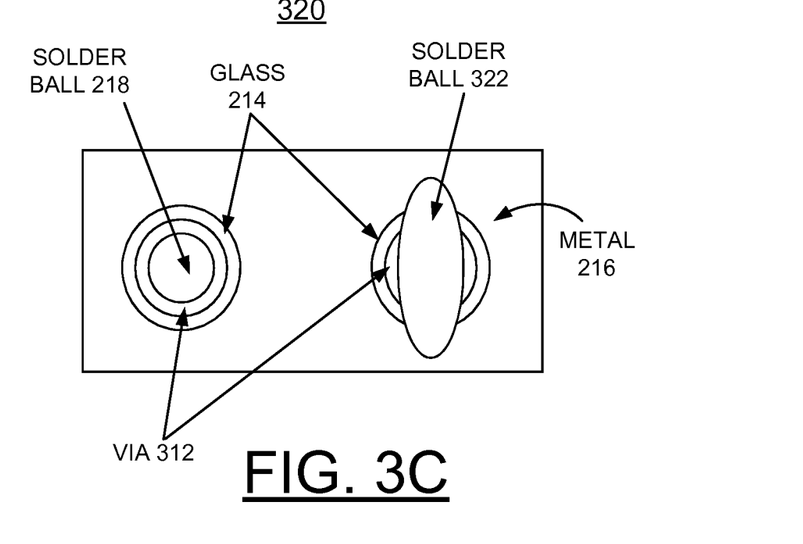
FIGS. 3C, and 3D are top views illustrating other example DRAM TSV stacks incorporating a decoupling capacitor in accordance with the preferred embodiments.
Figure 3D:
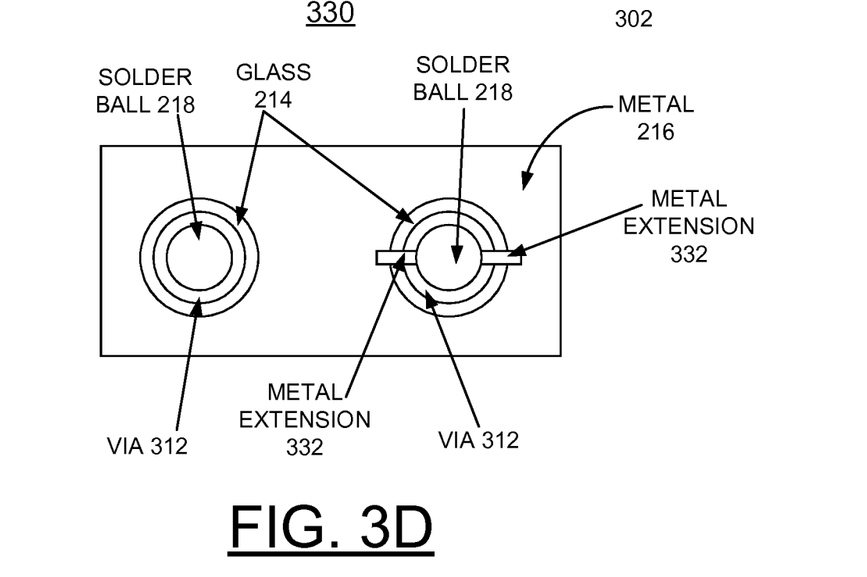
Figure 4A:
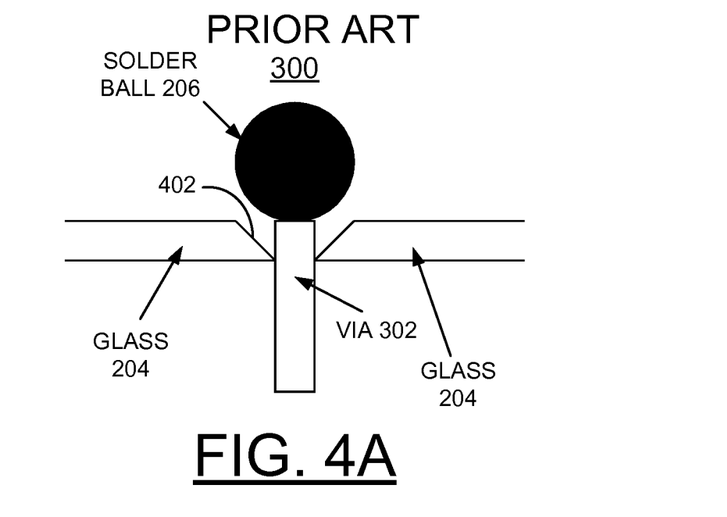
FIGS. 4A, and 4B are detailed side views respectively illustrating the conventional DRAM TSV stack of FIG. 3A, and the example DRAM TSV stack incorporating the decoupling capacitor of FIG. 3B in accordance with preferred embodiments.
Figure 4B:
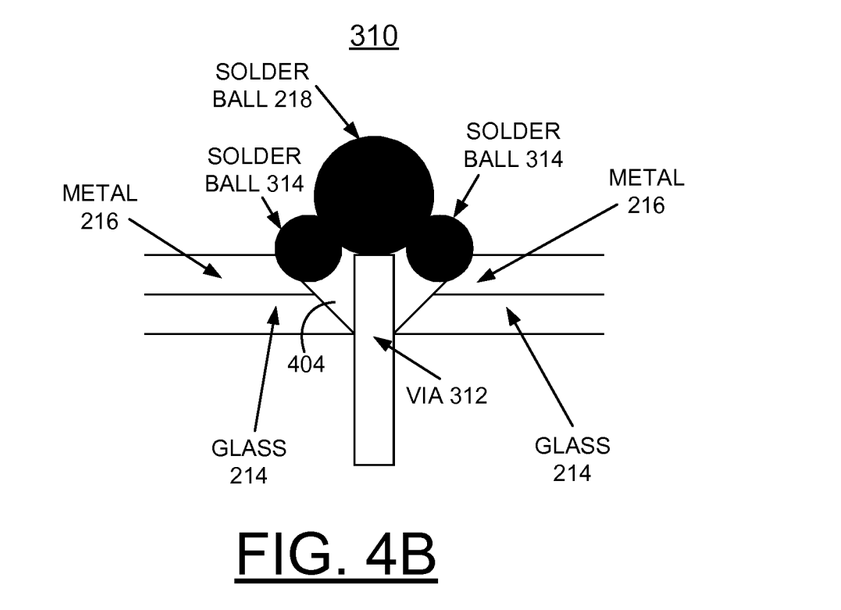
Figure 4C:
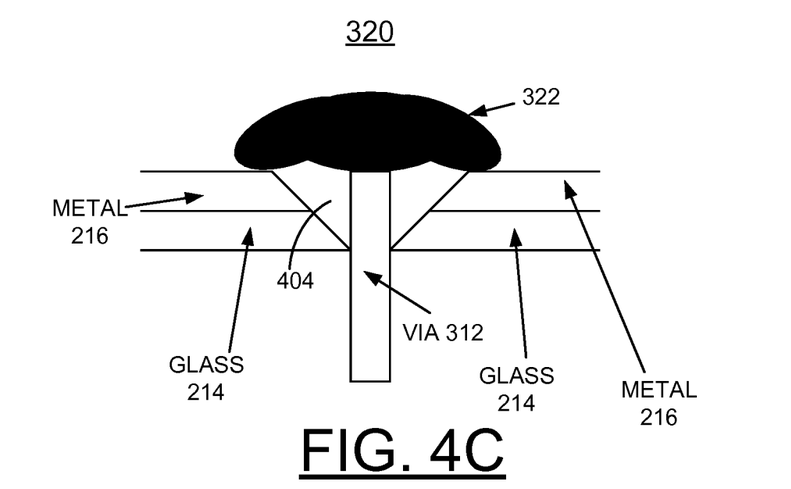
FIGS. 4C, and 4D are detailed side views respectively illustrating the other example DRAM TSV stacks incorporating the decoupling capacitor of FIGS. 3C and 3D in accordance with preferred embodiments.
Figure 4D:
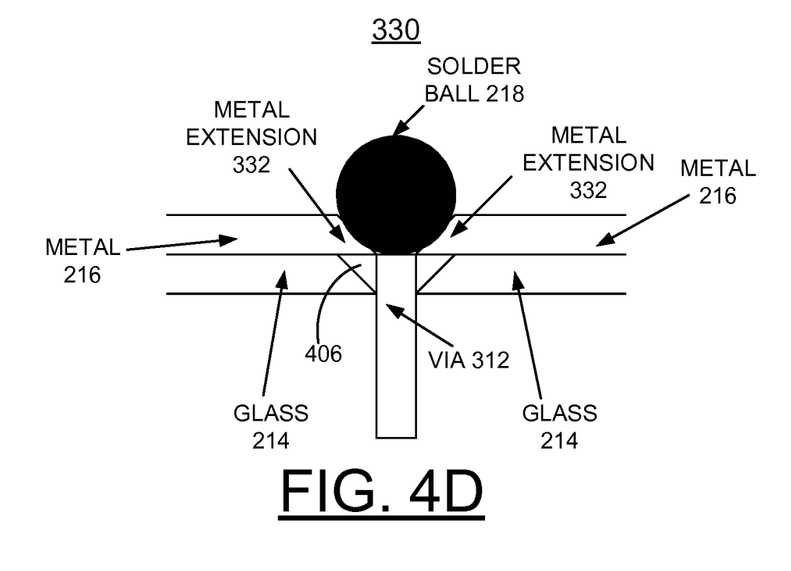

In accordance with features of the invention, the metal layers 216 are connected to a respective power supply voltage source, for example, providing the metal layer in contact with two additional solder balls such as illustrated and described with respect to FIGS. 3B and 4B, providing the metal layer in contact with an enlarged, elongated solder ball such as illustrated and described with respect to FIGS. 3C and 4C, or providing the metal layer to grow metal extending to a pad, one pad per layer such as illustrated and described with respect to FIGS. 3D and 4D. The metal layers 216 in the DRAM TSV stack, such as the DRAM TSV stack 210, are separated by the inserted dielectric material 220 having the height of the solder balls 218.

In FIG. 3B, the illustrated DRAM TSV stack 310 includes a plurality of vias 312 extending through the glass layer 214 and the metal layer 216 with a respective solder ball 218 disposed on the vias 312. A pair of additional solder balls 314 are provided to connect one respective solder ball 218 to the metal layer 216 to provide conductivity to one respective via 312 connected to the one respective solder ball 218.

Referring to FIGS. 3C, and 3D, there are shown top views illustrating other example DRAM TSV stacks incorporating the decoupling capacitor respectively generally designated by the reference characters 320, 330 in accordance with preferred embodiments.

In FIG. 3C, the illustrated DRAM TSV stack 320 includes a plurality of vias 312 extending through the glass layer 214 and the metal layer 216 with one solder ball 218 disposed on one via 312 and an elongated solder ball 322 provided to connect another via 312 to the metal layer 216. The elongated solder ball 322 provides conductivity from the respective connected via 312 to the metal layer 216.

In FIG. 3D, the illustrated DRAM TSV stack 330 includes a plurality of vias 312 extending through the glass layer 214 and the metal layer 216 with one solder ball 218 disposed on one via 312 and a pair of metal extensions 332 provided to connect another via 312 to the metal layer 216. The metal extensions 332 provide conductivity from the respective connected via 312 to the metal layer 216.

Referring to FIGS. 4A, and 4B, there are shown more detailed side views respectively illustrating the conventional DRAM TSV stack 300 of FIG. 3A, and the example DRAM TSV stack 310 incorporating the decoupling capacitor of FIG. 3B in accordance with preferred embodiments.

In FIG. 4A, the illustrated conventional DRAM TSV stack 300 includes a plurality of vias 302, each extending through an opening 402 etched or formed in the glass layer 204 with a respective solder ball disposed on the vias 302.

In FIG. 4B, the illustrated DRAM TSV stack 310 including a plurality of vias 312, each via extending through an opening 404 etched or formed through the glass layer 214 and the metal layer 216 with a respective solder ball 218 disposed on the vias 312. The opening 404 is tapered with a base opening portion in the glass layer 214 generally corresponding in size to the connected via 312. The pair of additional solder balls 314 are provided within the opening 404 to connect one respective solder ball 218 to the metal layer 216 providing conductivity to the respective via 312 connected to the one respective solder ball 218.

Referring to FIGS. 4C, and 4D, there are shown more detailed side views respectively illustrating the other example DRAM TSV stacks 320, 330 incorporating the decoupling capacitor of FIGS. 3C and 3D in accordance with preferred embodiments.

In FIG. 4C, the illustrated DRAM TSV stack 320 including the plurality of vias 312, each extending through the opening 404 etched or formed through the glass layer 214 and the metal layer 216 with the elongated solder ball 322 provided to connect another via 312 to the metal layer 216. The elongated solder ball 322 provides conductivity from the respective connected via 312 to the metal layer 216.

In FIG. 4D, the illustrated DRAM TSV stack 330 including the plurality of vias 312 extending through an opening 406 etched or formed through the glass layer 214 with the pair of metal extensions 332 provided to connect the respective via 312 to the metal layer 216. The metal extensions 332 provide conductivity from the respective connected via 312 to the metal layer 216.

While the present invention has been described with reference to the details of the embodiments of the invention shown in the drawing, these details are not intended to limit the scope of the invention as claimed in the appended claims.

What is claimed is:

1. A structure for implementing decoupling capacitors within a DRAM TSV stack comprising:
   a first semiconductor chip;
   a second semiconductor chip;
   said first and second semiconductor chips including a DRAM formed with a plurality of TSVs extending through the DRAM and filled with a conducting material;
   a first glass layer providing an insulator disposed on a top of the DRAM and a second glass layer providing an insulator disposed on a bottom of the DRAM;
   a first metal layer providing a conductor disposed on said first glass layer;
   a second metal layer providing a conductor disposed on said second glass layer;
   a respective solder ball disposed on respective ones of said TSVs and extending through an opening in said first and second metal layers and said first and second glass layers to connect said first and second semiconductor chips in the DRAM TSV stack;
   a dielectric disposed between said first and second metal layers in the DRAM TSV stack; and said first and second metal layers being connected to at least one TSV by one said respective solder ball and being connected to a voltage source to complete the decoupling capacitor.

2. The structure as recited in claim 1 wherein said conducting material filling said plurality of TSVs includes a metal or metal alloy.

3. The structure as recited in claim 1 wherein said first and second metal layers are formed of a selected metal from a group including copper, aluminum, and tungsten.

4. The structure as recited in claim 1 wherein said first and second metal layers are connected to at least one TSV by a pair of solder balls connected to each said respective first and second metal layers and said respective solder ball.

5. The structure as recited in claim 1 wherein said first and second metal layers being connected to at least one TSV by one said respective solder ball includes an elongated solder ball extending between each said respective first and second metal layers and one said TSV.

6. The structure as recited in claim 1 wherein said first and second metal layers are connected to at least one TSV by a pair of metal extensions of each said respective first and second metal layers.

7. The structure as recited in claim 1 wherein said dielectric includes an electrolyte creating a battery.

8. The structure as recited in claim 1 wherein said opening includes a tapered opening with a base opening portion in said first and second glass layers generally corresponding in size to the connected TSV.

9. The structure as recited in claim 1 wherein the decoupling capacitor minimizes impact of power supply voltage droops when the DRAM changes from a state with low power consumption to a state with high power consumption.

* * * * *